(12) United States Patent
Kataoka et al.

(10) Patent No.: US 6,270,889 B1
(45) Date of Patent: *Aug. 7, 2001

(54) MAKING AND USING AN ULTRA-THIN COPPER FOIL

(75) Inventors: Takashi Kataoka, Ageo; Yutaka Hirasawa, Okegawa; Takuya Yamamoto; Kenichiro Iwakiri, both of Ageo; Akiko Sugioka, Yono; Junshi Yoshioka, Ageo, all of (JP)

(73) Assignee: Mitsui Mining & Smelting Co., Ltd. (JP)

(*) Notice: Subject to any disclaimer, the term of this patent is extended or adjusted under 35 U.S.C. 154(b) by 0 days.

This patent is subject to a terminal disclaimer.

(21) Appl. No.: 09/220,245

(22) Filed: Dec. 23, 1998

Related U.S. Application Data

(63) Continuation-in-part of application No. 09/039,960, filed on Mar. 16, 1998.

(30) Foreign Application Priority Data

Jan. 19, 1998 (JP) .................................................. 10-020150

(51) Int. Cl.[7] ........................................................ B32B 7/12
(52) U.S. Cl. ........................ 428/352; 428/336; 428/545; 428/615; 156/289
(58) Field of Search .................................... 428/545, 615, 428/336, 344, 352

(56) References Cited

U.S. PATENT DOCUMENTS

| | | | |
|---|---|---|---|
| 3,281,339 | 10/1966 | Edgar et al. | 204/3 |
| 3,616,186 | * 10/1971 | Blackwell | 161/187 |
| 3,625,844 | 12/1971 | McKean | 204/140 |
| 3,674,656 | 7/1972 | Yates | 204/13 |
| 3,886,022 | 5/1975 | Konicek | 156/247 |
| 3,936,548 | 2/1976 | Konicek | 427/405 |
| 3,984,598 | 10/1976 | Sarazin et al. | 428/336 |
| 3,998,601 | * 12/1976 | Yates et al. | 428/607 |
| 4,088,544 | * 5/1978 | Hutkin | 205/170 |
| 4,357,395 | 11/1982 | Lifshin et al. | 428/607 |
| 4,383,003 | * 5/1983 | Lifshin et al. | 428/611 |
| 4,394,419 | * 7/1983 | Konicek | 428/416 |
| 4,568,413 | * 2/1986 | Toth et al. | 156/151 |
| 5,049,221 | * 9/1991 | Wada et al. | 156/151 |
| 5,066,366 | * 11/1991 | Lin | 205/76 |

FOREIGN PATENT DOCUMENTS 1458260  12/1976  (GB) .............................. C25D/1/04

* cited by examiner

Primary Examiner—Cathy Lam
(74) Attorney, Agent, or Firm—Jenkens & Gilchrist

(57) ABSTRACT

This invention provides a composite foil comprising an organic release layer between a metal carrier layer and an ultra-thin copper foil, and a process for producing such composite foils comprising the steps of depositing the organic release layer on the metal carrier layer and then forming an ultra-thin copper foil layer on said organic release layer by electrodeposition. The organic release layer preferably is a nitrogen-containing compound, a sulfur-containing compound, or a carboxylic acid, which provides a uniform bond strength which is adequate to prevent separation of the carrier and ultra-thin copper foil during handling and lamination, but which is significantly lower than the peel strength of a copper/substrate bond, so that the carrier can easily be removed after lamination of the composite foil to an insulating substrate. The invention also includes laminates made from such composite foils and printed wiring boards made from such laminates.

43 Claims, 3 Drawing Sheets

MAKING AND USING AN ULTRA-THIN COPPER FOIL

CROSS-REFERENCE TO RELATED APPLICATION

This is a continuation-in-part of U.S. application Ser. No. 09/039,960, filed Mar. 16, 1998.

FIELD OF THE INVENTION

The present invention relates generally to making and using ultra-thin copper foil and, more particularly, to a composite foil which facilitates handling of ultra-thin copper foil in the production of printed wiring boards. The invention also relates to a composite foil in which an organic release layer with uniform bonding strength is disposed between a metallic carrier and an ultra-thin copper foil, and the processes of producing and using such a composite foil.

BACKGROUND OF THE INVENTION

With the recent miniaturization and densification of electronic equipment, the pattern widths and spacing of printed wiring boards have become smaller. As a result, the copper foil used has tended to become thinner, for example, 12 μm thick foils, rather than conventional 35 μm and 18 μm foils. Recently, the need for this copper foil has increased and ultra-thin copper foils have been tried. Handling a copper foil of 12 μm or less, however, is difficult. For example, it can wrinkle or tear while being produced and/or handled. Similar problems occur when an ultra-thin copper foil is used as the outer layer of a multi-layer printed wiring board. A method of preventing these problems with handling ultra-thin copper foil is needed.

There has been previously proposed a composite foil in which an ultra-thin copper foils is supported on a metal carrier layer so as to allow the copper foil to be separated from the carrier layer. Several carrier metals and types of release layers have been suggested. Producing printed wiring boards from such supported ultra-thin copper foil(s) could be done by electrolytic deposition of a copper layer having a thickness of 1–12 μm onto a metal carrier layer having a thickness of 18–70 μm. then applying the surface of the copper layer to a prepreg, such as a glass-reinforced epoxy resin or the like, and laminating by hot pressing. Finally, the metal carrier layer would be separated, leaving a copper-clad laminate from which a printed wiring board can be made.

When a copper sheet is used as a carrier, a chromium layer may be used as a release layer between the copper foil and the copper carrier layer, as has been disclosed in, for example, Japanese Patent Application Publication (Examined) No. Sho 53-18329.

Alternatively, when aluminum is used as the carrier layer, several types of release layers have been proposed, for example:

1. a release layer of the sulfides or oxides of Cr, Pb, Ni and Ag (for example, in U.S. Pat. No. 3,998,601);
2. a release layer formed of nickel or nickel alloy plating after zinc immersion (for example, in U.S. Pat. No. 3,936,548);
3. a release layer of aluminum oxide (for example, in Japanese Patent Application Publication (Examined) No. Sho 60-31915 and U.K. Patent No. GB 1,458,260); or
4. a release layer of silica (for example, in U.S. Pat. No. 4,357,395).

Such conventional supported copper foils have, however, been found to present problems.

When the release layer is not uniform over the surface of the carrier layer, bond strength between the carrier layer and the ultra-thin copper foil is uneven. Consequently, when the carrier layer is peeled off after laminating a composite foil, some of the ultra-thin copper foil may remain on the carrier layer or some of the carrier layer may remain on the ultra-thin copper foil. In either case, the required circuit pattern cannot be made. Further, weak bond strength may cause an ultra-thin copper foil to partially or entirely separate from the carrier layer during production and use of the composite foil.

When oxides, sulfides, chromium or inorganic materials, such as chromium or the like, are used as release layers, some of the inorganic material remains on the surface of the ultra-thin copper foil after the carrier layer is peeled off. This inorganic material must be removed before the circuit patterns are made, making it necessary to add extra processing steps.

Finally, when the composite foil is laminated to a substrate, such as an epoxy prepreg at high temperatures, it often becomes difficult to peel off the carrier layer.

Because of these problems, composites of ultra-thin copper foil on a support layer are not generally used in industry at present, despite the proposed methods just discussed.

Accordingly, an object of the present invention is to provide a composite foil which overcomes the problems discussed above and a process for making such composite foils. Another object of the present invention is to provide a copper-clad laminate which is made by using such a composite foil, and a printed wiring board employing such a copper-clad laminate.

The inventors have investigated the metals and/or metal compounds which have conventionally been suggested as release layers for composite foils in the prior art. They have found that when peeling off a support layer from an ultra-thin copper foil after the copper foil has been laminated to a resin substrate by hot pressing, the peel strength is variable and the bond can be too strong. Also, when a release layer is not uniformly formed, or when heat is used during laminating, the metal used in the release layer may be diffused into both the support layer and the ultra-thin copper foil.

The inventors have also investigated organic compounds which are suitable for a release layer of the composite foils which are used for preparing printed wiring boards.

In U.S. Pat. No. 3,281,339, benzothiazole (BTA) was disclosed to be useful as a stripping agent in production of copper sheets or foils by electrodeposition. The principal use of BTA was to make possible a continuous production of a copper sheet using a revolving drum cathode in which the copper sheet electrodeposited on a BTA-coated surface of the revolving drum cathode is continuously separated from the surface. However, the U.S. patent is completely silent on the composite foils used for preparing printed wiring boards, and the properties and materials suitable for the release layers used for the composite foils.

The present invention has been made based on the present inventors' finding that it is possible to employ certain organic compounds as the release layers of the composite foils, even when they are subjected to the elevated temperatures required for lamination of printed circuit boards.

SUMMARY OF THE INVENTION

As used in this invention, the term "peel strength (A)" refers to the force required to separate the carrier layer from the ultra-thin copper foil which has been laminated on a substrate. The term "peel strength (B)" refers to the force required to separate the ultra-thin copper-foil from a substrate to which it has been laminated.

The present invention relates to a composite foil with a new release layer of an organic compound and the release layer generally has the following features.

1. The release layer is easy to apply.
2. The peel strength (A) between the ultra-thin copper foil and the carrier layer is uniform, and has a relatively low value compared to the peel strength (B) of the copper foil after lamination to a substrate.
3. Mechanical polishing and pickling to remove an inorganic material which remains on the surface of an ultra-thin copper foil is not necessary since no inorganic material is used. Thus, the formation of wiring patterns is simplified by reducing the number of processing steps.
4. Although peel strength (A) is low, it is sufficient to prevent separation of the ultra-thin copper foil from the carrier layer during handling.
5. The composite foil has sufficient peel strength (B) after lamination to a substrate and the ultra-thin copper foil does not separate from the substrate during processing into a printed circuit board.
6. The carrier layer can be separated from the ultra-thin copper foil even after laminating at elevated temperatures.
7. It is easy to recycle the carrier layer after it has been separated from since the residual release layer is easy to remove.

Organic compounds which have been found useful in making composite foils may have the following characteristics.

1. They are believed to form a chemical bond with copper.
2. They retain the ability to separate a copper carrier from a copper foil even after exposure to the temperatures used in laminating the copper foil to an insulating substrate, preferably at a temperature of not less than 150° C., particularly in the range of about 175–200° C.
3. They form a chemical bond with the ultra-thin copper foil and the carrier layer, and give a peel strength (A) of the carrier layer from the ultra-thin copper foil which is relatively low compared to the peel strength (B) between the ultra-thin copper foil and the insulating substrate. The peel strength (A) is sufficient to prevent their separation during handling and lamination, but low enough to permit the carrier layer to easily be removed after the composite foil has been laminated to the substrate.
4. They provide a very thin release layer which permits uniform electrodeposition of the copper foil on the carrier layer.

Preferred organic compounds include nitrogen containing compounds, sulfur-containing compounds and carboxylic acids.

Preferably, the nitrogen-containing compounds are compounds having a substituent, such as triazole compounds having a substituent. Examples of the triazole compounds having a substituent include CBTA, BTD-U and ATA (see discussion below for acronyms). The sulfur-containing compounds include MBT, TCA and BIT (see discussion below for acronyms). It is preferred that the carboxylic acids be mono-carboxylic acids. Examples of mono-carboxylic acids include oleic acid, linolic acid, and linolenic acid.

In one aspect, the invention provides a composite foil having an organic release layer having the characteristics just described, which is disposed between a metal carrier layer, which may also be a foil, and an ultra-thin copper foil.

In another aspect, the invention provides a process for producing a composite foil by the steps of forming an organic release layer on a metal carrier layer and thereafter forming an ultra-thin copper foil on the organic release layer by electrodeposition.

A copper-clad laminate of the present invention comprises the composite foil according to the invention laminated to an insulating substrate. Alternatively, it comprises the ultra-thin copper foil laminated to the insulating substrate which remains after peeling off the metal carrier layer.

A printed wiring board of the present invention comprises the copper clad laminate having the ultra-thin copper foil exposed by separating the metal carrier layer and a wiring pattern can be formed from the exposed copper foils just described.

The invention also provide a multi-layer printing wiring board using the printed wiring board as described above.

That is, the multi-layer printed wiring board can be formed by laminating on at least one side of an inner layer board on which wiring patterns were previously formed a composite foil as described above to obtain a copper clad laminate, separating the metal carrier layer from the copper clad laminate to expose the ultra-thin copper foil, and forming a wiring pattern on the ultra-thin copper foil. A plurality of the multi-layer printed wiring boards of the invention can be laminated to form a multi-layer printed wiring board having a higher number of the layered wiring patterns.

The multi-layer printed wiring board of the invention can also be formed by laminating a plurality of printed wiring boards of the invention.

DESCRIPTION OF ILLUSTRATIVE EMBODIMENTS

In general, the composite foil of the present invention is generally characterized by having an organic release layer between a metal carrier layer and an ultra-thin copper foil.

Figure 1:
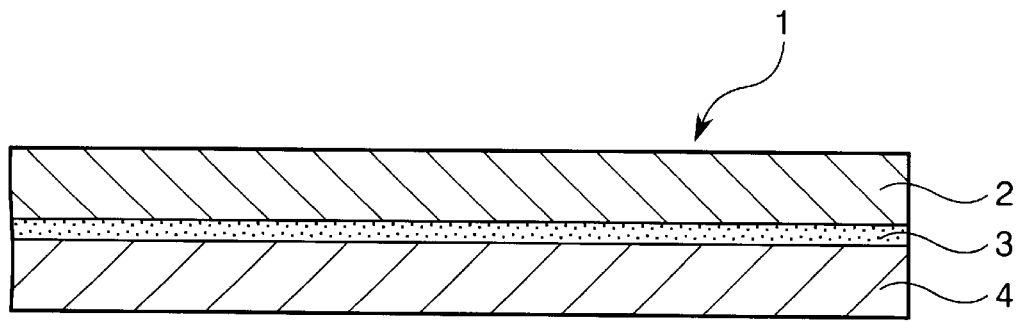
FIG. 1 shows a schematic cross sectional view of an embodiment of the composite copper foil according to the present invention.

FIG. 1 shows a schematic cross sectional view of an embodiment of the copper foil of the invention and, as shown in FIG. 1, the composite foil 1 of the embodiment is made by forming on a metal carrier 2, an organic release layer 3 and an ultra-thin copper foil 4 in this order.

In the invention, the organic release layer preferably satisfies the characteristics discussed above. The release layer is an organic compound, particularly nitrogen-containing compounds, sulfur-containing compounds, and carboxylic acids.

As the metallic carrier layer, copper or a copper alloy is preferably used since the release layer is believed to chemically bond to copper. An organic compound used in the present invention may be applied to a support material other than copper or a copper alloy, for example, copper-plated aluminum. Other metals could be used, provided the release layer forms a uniform chemical bond with that metal as well as with the ultra thin copper foil. The thickness of the supporting metallic layer is not considered to be critical, and it may be a foil from about 18–70 $\mu$m thick. Since a typical carrier layer is relatively thin, it will also be referred to as a foil, but it is to be understood that the support layer could be thicker than ordinary foils. For example, heavier carrier sheets up to about 5 mm thick may be used.

The metal carrier layer may be an electrodeposited copper foil which typically has a rough or matte side and a smooth or shiny side. The release layer on which the ultra-thin copper foil is deposited can be formed on the matte or shiny surface. When the electrodeposition is carried out on a release layer formed on the shiny side, the resultant ultra-thin copper foil has low roughness and is suitable for wiring patterns having fine pitch. When the electrodeposition is carried out on a release layer formed on the matte side, the resultant ultra-thin copper foil has high roughness and can improve the peel strength (B) from the insulating substrate.

The thickness of the ultra-thin copper foil to be formed on the organic release layer is generally not more than 12 $\mu$m thick, and may be much thinner, for example, 5–7 $\mu$m or less. A copper foil having a thickness of more than 12 $\mu$m can be produced by conventional processes, and can be handled without a carrier layer. The ultra-thin copper foil is formed by electrodeposition and the ultra-thin copper layer thus obtained is suitable for making circuit patterns and has acceptable peel strengths (A) and (B).

Certain nitrogen-containing compounds and sulfur-containing compounds have been found to be useful as an organic release layer, particularly heterocyclic compounds. The nitrogen-containing compounds are preferably nitrogen-containing compounds having a substituted functional group and, among them, particularly preferred are triazole compounds having functional groups, such as carboxybenzotriazole (CBTA), N,N'-bis(benzotriazolylmethyl) urea (BTD-U) or 3-amino-1H-1,2,4-triazole (ATA). The sulfur-containing compounds include mercaptobenzothiazol (MBT), thiocyanuric acid (TCA), and 2-benzimidazolethiol (BIT), and particularly preferred are MBT and TCA. Some organic compounds have been found to lack the ability to release ultra-thin copper foil from a copper carrier as is shown in the following Examples.

Another class of compounds which have been found to be useful as an organic release layer are carboxylic acids which include higher molecular weight carboxylic acids. Among the carboxylic acids, preferred are mono-carboxylic acids, such as the fatty acids, which can be derived from animal or vegetable fats or oils. These may be either saturated or unsaturated. Not all carboxylic acids are useful, however, as will be seen in the following Examples.

Carboxylic acids which have been found to be useful as release layers are fatty acids (higher molecular weight mono-carboxylic acids), especially unsaturated fatty acids, such as oleic acid, linoleic acid, and linolenic acid. Other acids which have been found to lack the ability to release ultra-thin copper foil from a copper carrier are shown in the following Examples.

When measured in accordance with the Japanese standard JIS-C-6481, the range of the peel strength (A) between the metal carrier and the ultra-thin copper foil in the composite foils of the invention is about 0.005–0.3 kgf/cm, preferably 0.005–0.1 kgf/cm, to assure that the carrier layer can be separated from the ultra-thin copper foil after laminating the composite foil on an insulating substrate. When less than 0.005 kgf/cm, the peel strength (A) is so weak that bulging or separating of the ultra-thin copper foil may occur during lamination with a substrate or during punching or drilling of a laminate or a circuit board. When greater than 0.3 kgf/cm, the bond strength is so large that it may be necessary to provide a special treatment when separating the metal carrier layer as, for example, the use of an aqueous medium in U.S. Pat. No. 3,886,022.

A composite foil of the invention has little or no variability in the peel strength (A) between the metal carrier layer and the ultra-thin copper foil. The bond strength is consistent both across individual composite foils and among multiple examples of the composite foil.

Since only a thin organic layer is attached to the surface of an ultra-thin copper foil after separating the supporting metallic layer, removal of the organic film is possible by cleaning with a dilute acid solution. A harsh pickling step is not necessary. In addition to this, the organic layer remaining on the surface of the ultra-thin copper foil after the carrier has been removed can serve as a passivator to prevent oxidation. Furthermore, since it is easy to recycle a supporting metallic layer after it has been separated, the production and environmental problems discussed above are avoided.

In producing the composite foil of the invention, the organic release layer is formed on the metal carrier layer, and thereafter the ultra-thin copper layer is deposited on the organic release layer. Prior to the formation of the organic release layer, it is preferable to remove any copper oxide on the surface of the metal carrier layer to assure that a uniform-bond strength is achieved. This may be done, for example, by rinsing the carrier in a dilute acid solution, e.g., dilute sulfuric acid. The organic release layer may be applied to the metal carrier layer by dipping or coating, or any method by which a uniform layer is formed on the carrier, for example, by dipping the metal carrier layer into an aqueous solution of the selected organic compound to form the organic release layer. Concentration of the organic compound in the aqueous solution is preferably about 0.01–1% by weight, or about 0.1–10 g/L, and dipping time is preferably about 5–60 seconds. Although higher concentrations and longer dipping times are possible, they are not preferred since they would increase costs and decrease productivity. After removing the carrier from the solution, it is preferable that the excess be removed by rinsing with water so that only a very thin layer bonded to the carrier surface remains. The thickness of the film after rinsing is difficult to measure accurately, but it is believed to be about 30–100 Å, preferably 30–60 Å. The range of acceptable thicknesses of the release layer is not known, but if the layer is too thin, the ultra-thin copper foil will adhere to the carrier, while if the release layer is too thick, uniform electrodeposition of copper is not feasible.

The ultra-thin copper foil preferably is electrodeposited on top of the organic release layer which has been placed on the metal carrier. There are several methods of electrodepositing copper, such as using a copper pyrophosphate electrodepositing bath or an acidic copper sulfate electrodepositing bath, among others. While any type of electrodepositing bath may be used to form the ultra-thin copper foil, some types are preferred. To avoid undesirable pin holes and/or porosity, initial depositing may be done in an electrolytic bath substantially free of acid, such as a copper cyanide bath or a copper pyrophosphate bath, which give more uniform electrodeposition of copper. The electrodeposition using copper pyrophosphate is preferred since it has advantages with respect to the environment and safety of operations. If two copper electrodepositing steps are used, it is preferred that a first copper electrodepositing step providing a thickness of at least 0.5 µm, preferably 0.5–1.0 µm, is done in a copper pyrophosphate bath, followed by a second electrodepositing step using a copper sulfate bath to provide the desired thickness, for example, up to 12 µm of the ultra-thin copper foil.

The conditions for the electrodeposition using copper pyrophosphate are not believed to be critical. It is preferred, however, that the copper concentration in the copper pyrophosphate bath be about 10–50 g/L and the potassium pyrophosphate about 100–700 g/L. The pH of the electrolytic solution preferably should be about 7–12. The bath temperature should be about 30–60° C., and the current density about 1–10 A/dm$^2$.

Electrodeposition of copper using sulfate baths are advantageous if one considers productivity and cost, and generally they have been used successfully without first depositing a thin layer of copper from a pyrophosphate bath. The conditions for the electrodeposition using acidic copper sulfate are also not considered critical. It is preferred, however, that the copper concentration in the copper sulfate bath be about 30–100 g/L, and that the sulfuric acid be about 50–200 g/L. The bath temperature of electrolytic solution preferably is about 30–80° C. and the current density about 10–100 A/dm$^2$.

In order to enhance adhesion of the ultra-thin copper foil to an insulating substrate, a bond enhancing treatment may be placed on the ultra-thin copper foil layer by conventional methods, such as a nodularizing treatment in which a nodular copper is deposited on the surface of the foil by adjusting electrodepositing conditions. An example of a nodularizing treatment may be found in U.S. Pat. No. 3,674,656. In addition, the surface of the ultra-thin copper foil may be subjected to a conventional passivation treatment to prevent oxidation of the ultra-thin copper foil. The passivation treatment may be done directly on the ultra-thin copper foil or after the nodularizing treatment. The passivation treatment is generally carried out by depositing zinc, zinc chromate, nickel, tin, cobalt and chromium on the surface of the ultra-thin copper foil. An example of such methods may be found in U.S. Pat. No. 3,625,844.

The surface of the treated ultra-thin copper foil produced by the methods just described will be laminated to an insulating substrate using heat and pressure to obtain a copper-clad laminate.

Figure 2:
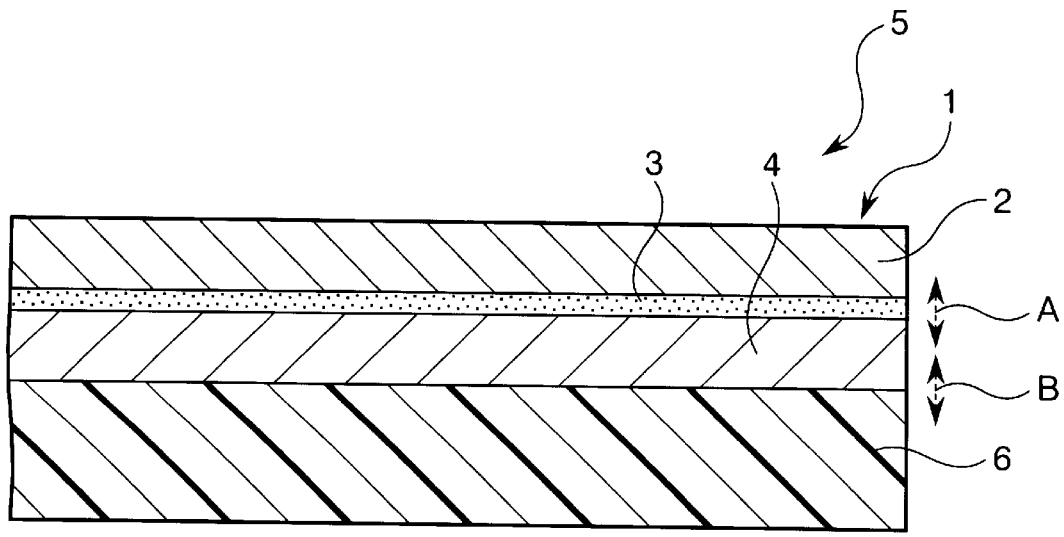
FIG. 2 shows a schematic cross sectional view of an embodiment of the copper-clad laminate according to the present invention.

FIG. 2 shows a schematic cross sectional view of such a laminate thereof. As shown in FIG. 2, the copper-clad laminate 5 is made by laminating on an insulating substrate 6 the composite foil 1 as shown in FIG. 1, so as to place the ultra-thin copper foil 4 of the composite foil 1 in contact with the substrate 6.

Typically, the laminating temperature is 150° C. or higher, particularly 175–200° C. As the insulating substrate, any of the resin substrates which are used to make circuit boards for electronic equipment can be used. Such resin substrates may include FR-4 (glass-fiber-epoxy), paper-phenolic, paper-epoxy, polyimides and the like. The metal carrier layer is then separated, leaving a copper-clad laminate consisting of the ultra-thin copper foil and insulating substrate.

When described with reference to FIG. 2, the range of the peel strength (A) (in FIG. 2, indicated as A) of the metal carrier 2 from the ultra-thin copper foil 4, measured in accordance with JIS-C-6481, is lower than the peel strength (B) (in FIG. 2, indicated as B) of the ultra-thin copper foil 4 from the substrate 6, to assure that the carrier layer 2 can be separated from the ultra-thin copper foil 4 after laminating the composite foil 1 on the insulating substrate 6.

Because the ultra-thin copper foil is too thin and weak to directly measure the peel strength (B) in accordance with JIS-C-6481, an additional copper deposition, for example, up to a total thickness of 18 µm, is applied to the ultra-thin copper foil.

The copper-clad laminate is suitably used for preparing a printed wiring board.

For example, the printed wiring board of the invention can be made by exposing the ultra-thin copper foil of the copper-clad laminate of the invention by separating the metal carrier layer and forming a wiring pattern from the exposed copper foil just described.

Figure 3:
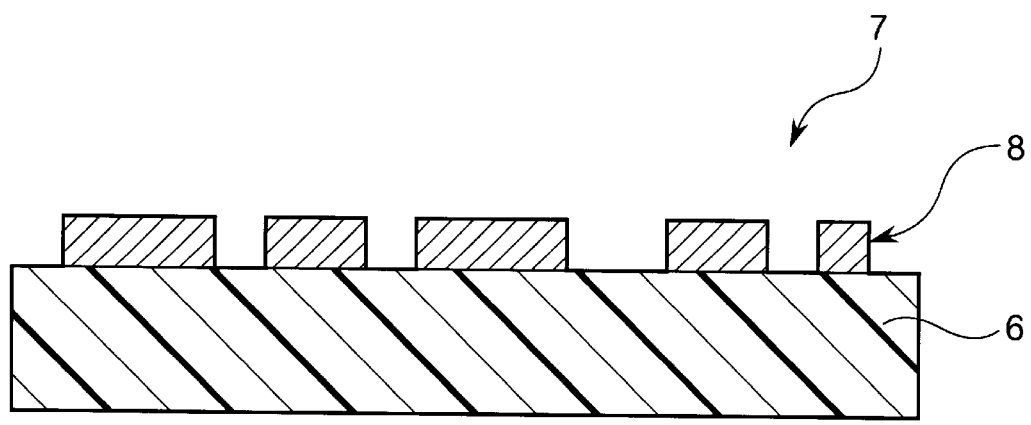
FIG. 3 shows a schematic cross sectional view of an embodiment of the printed wiring board according to the present invention.

FIG. 3 shows a schematic cross sectional view of an embodiment of the printed wiring board of the present invention and, as shown in FIG. 3, the printed wiring board 7 comprises a substrate 6 and a printed wiring pattern 8 formed thereon.

The printed wiring board 7 can be made by exposing the ultra-thin copper foil 4 of the copper-clad laminate 5 shown in FIG. 2 by separating the metal carrier layer 2, removing the remaining release layer 3 from the surface of the ultra-thin copper foil 4, if present, and forming a wiring pattern 8 from the exposed copper foil 4.

A multi-layer printed wiring board can be easily prepared by using the printed wiring board prepared as described above.

For example, the multi-layer printed wiring board can be made by using a copper-clad laminate formed by laminating on at least one side of an inner layer board on which wiring patterns were previously formed the composite foil of the invention to obtain a copper clad laminate, separating the metal carrier layer from the copper clad laminate to expose the ultra-thin copper foil, and forming a wiring pattern on the ultra-thin copper foil.

The multi-layer printed wiring board of the invention can also be formed by laminating a plurality of printed wiring boards of the invention.

That is, the multi-layer printed wiring board can be formed by laminating on at least one side of the printed wiring board of the invention the composite foil of the invention to obtain a copper clad laminate, separating the metal carrier layer from the copper clad laminate to expose the ultra-thin copper foil, and forming a wiring pattern on the ultra-thin copper foil.

In both cases of preparing the multi-layer printed wiring board of the invention, a plurality of the multi-layer printed wiring boards may be further laminated to obtain a multi-layer printed wiring board having a plurality of the layered wiring patterns.

Figure 4:
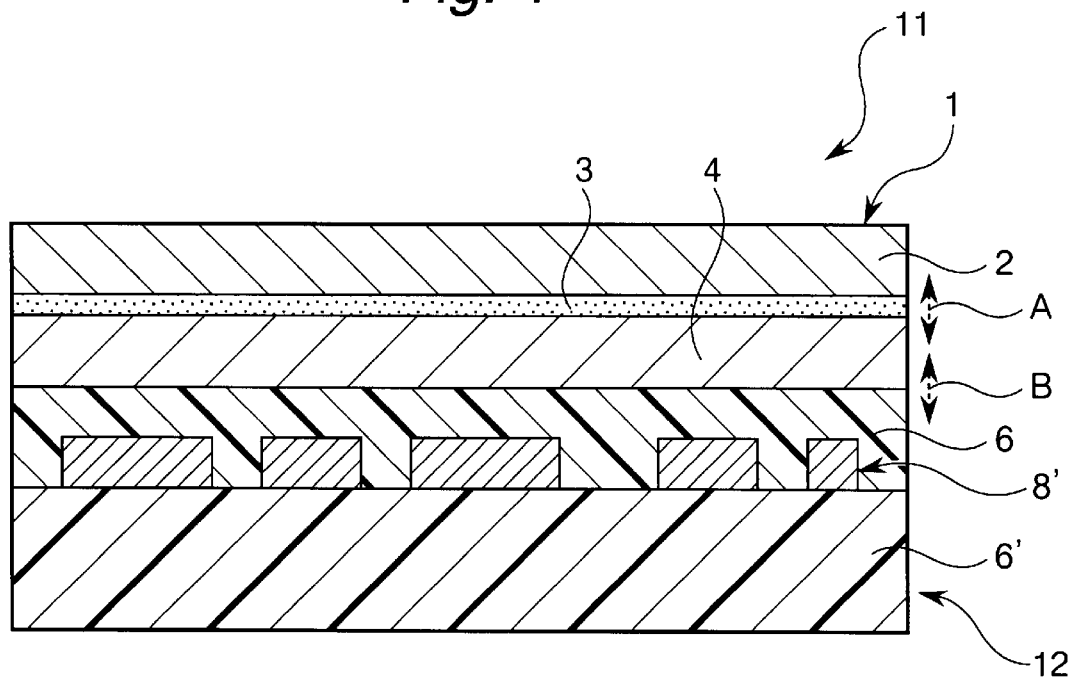
FIG. 4 shows a schematic cross sectional view of another embodiment of the copper-clad laminate according to the present invention.
Figure 5:
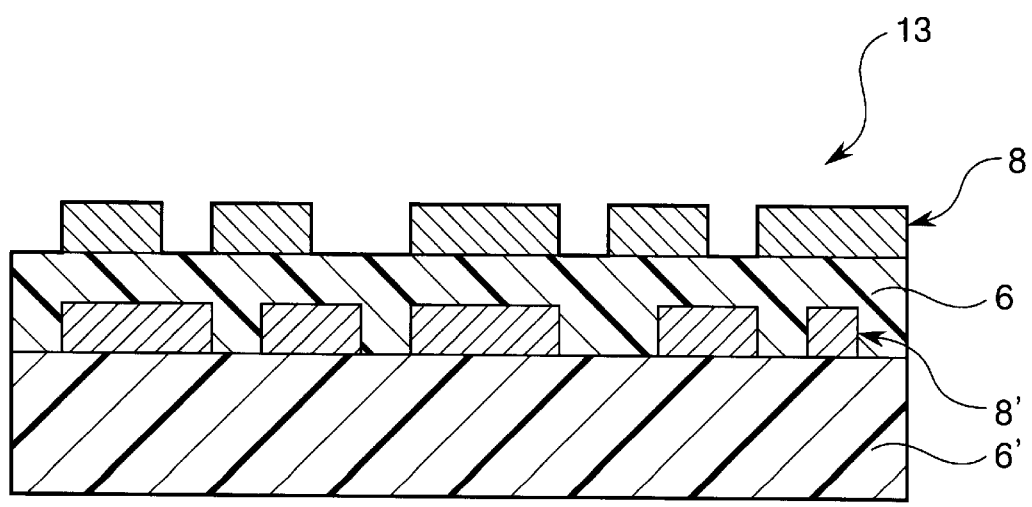
FIG. 5 shows a schematic cross sectional view of an embodiment of the multi-layer printed wiring board according to the present invention.

FIG. 4 shows a schematic cross sectional view of another embodiment of the copper-clad laminate of the invention, which is used for preparing a multi-layer printed wiring board as shown in FIG. 5. In FIG. 4, the copper clad-laminate 11 of the embodiment is formed by laminating a composite foil 1 on an inner layer board 12 via a substrate (prepreg) 6 by the process as described above.

The composite foil 1 comprises a metal carrier layer 2, and a release layer 3 and an ultra-thin copper foil 4 formed on the carrier layer 2 in this order. The inner board 12 comprises a substrate 6' and a wiring pattern 8', formed thereon. In the copper-clad laminate 11, the ultra-thin copper foil 4 of the composite foil 1 faces the wiring pattern 8 of the inner board 12 via the substrate 6.

FIG. 5 shows a schematic cross sectional view of an embodiment of the multi-layer wiring board of the invention, which is made from the copper-clad laminate 11 shown in FIG. 4. When described with reference to FIGS. 4 and 5, the production of the multi-layer printed wiring board 13 is carried out by separating the metal carrier 2, removing the remaining release layer 3 from the surface of the ultra-thin copper foil 4, if present, and forming a wiring pattern 8 on the exposed ultra-thin copper foil 4.

In the copper-clad laminate 11 as shown in FIG. 4, the inner layer board 12 may be the printed wiring board 7 as shown in FIG. 2. In such a case, it can be said that the multi-layer printed wiring board 13 shown in FIG. 5 comprises two printed wiring boards of the invention laminated with each other.

The present invention will be described in further detail with reference to the following examples.

EXAMPLE 1

As a metal carrier layer, an electrolytically deposited copper foil having a thickness of 35 $\mu$m was prepared. Such foils typically have a rough or matte side and a smooth or shiny side. Then, an organic release layer was formed on the shiny side of the foil, followed by a first copper depositing step, a second copper depositing step, a bond enhancing treatment, and a passivation treatment, using the following procedures.

A. Formation of the Organic Release Layer

The 35 $\mu$m copper foil was dipped into 2 g/L carboxybenzotriazole (CBTA) aqueous solution at 30° C. for 30 seconds, removed, and rinsed in deionized water to form an organic release layer of CBTA.

The thickness of the organic release layer was measured from an image obtained by SIMS (Secondary Ion Mass Spectroscopy) and found to be 60 Å.

B. First Copper Depositing Step

A cathodic electrodepositing treatment was carried out with a current density of 3 A/dm$^2$ by using a pyrophosphate electrodepositing bath, with a bath temperature of 50° C. and a pH of 8.5. The bath contained 17 g/L of copper and 500 g/L of potassium pyrophosphate. An ultra-thin copper foil having a thickness of 1 $\mu$m was deposited on the organic release layer.

C. Second Copper Depositing Step

The surface of the 1 $\mu$m ultra-thin copper foil was rinsed in deionized water and then electrodeposited at a current density of 60 A/dm$^2$ using a copper sulfate electrodeositing bath having a bath temperature of 50° C., and containing 80 g/L copper and 150 g/L sulfuric acid, to deposit about 5 $\mu$m thickness of copper, thereby obtaining an ultra-thin copper foil having a total thickness of about 6 $\mu$m.

D. Bond Enhancing Treatment

The bond enhancing treatment was carried out on the surface of the ultra-thin copper foil by a conventional nodularizing surface treatment using a copper sulfate electrodepositing bath. The current density was increased to form nodules of copper on the surface of the ultra-thin copper foil.

E. Passivation Treatment

A passivation treatment was applied to the surface of the bond enhanced ultra-thin copper foil by depositing zinc chromate from solution by conventional electrodeposition methods to obtain a composite foil ready for lamination.

The composite foil was laminated on four sheets of 0.1 mm thick FR-4 prepregs, and then hot pressed under a pressure of 25 kg/cm$^2$ at 175° C. for 60 minutes to obtain a copper-clad laminate. The peel strength (A) of the 35 $\mu$m copper carrier layer from the ultra-thin copper foil was measured in accordance with JIS-C-6481, and found to be 0.015 kgf/cm. The copper carrier layer could easily be separated from the copper-clad laminate, and the peel strength (A) was found to be uniform across the sample.

EXAMPLE 2

A composite foil was made in the same manner as in Example 1, except that an organic release layer was formed by using an aqueous solution of 2 g/L N,N'-bis (benzotriazolylmethyl) urea (BTD-U) instead of carboxybenzo-triazole (CBTA).

The composite foil was laminated on four sheets of 0.1 mm thick FR-4 prepregs, as in Example 1, using a pressure of 25 kg/cm$^2$, and a temperature of 140° C. for 60 minutes to obtain a copper-clad laminate. The peel strength (A) of the 35 $\mu$m copper carrier layer from the ultra-thin copper foil was measured in accordance with JIS-C-6481 and found to be 0.025 kgf/cm. The copper carrier could easily be separated from the copper-clad laminate, and the peel strength (A) was uniform across the sample. Then, the copper-clad laminate was post-cured at 175° C. for 60 minutes.

EXAMPLE 3

A composite foil was made in the same manner as in Example 1, except that the organic release layer was formed by using an aqueous solution of 2 g/L benzotriazole (BTA) instead of carboxybenzotriazole (CBTA).

The composite foil was laminated on four sheets of 0.1 mm thick FR-4 prepregs, as in Example 1, using a pressure of 25 kg/cm$^2$ at 140° C. for 60 minutes to obtain a copper-clad laminate. The peel strength (A) of the 35 $\mu$m copper carrier layer from the ultra-thin copper foil was measured in accordance with JIS-C-6481 and found to be 0.043 kgf/cm. The copper carrier could easily be separated from the laminate, and the peel strength (A) was uniform across the sample. Thereafter, the laminate was heated at 175° C. for 60 minutes to postcure it.

EXAMPLE 4

A composite foil was made as in Example 1, except that an organic release layer was formed by using a mixed aqueous solution of 2 g/L carboxybenzotriazole (CBTA) and 0.5 g/L benzotriazole (BTA).

The composite foil was laminated on two sheets of polyimide prepregs, each having a thickness of 0.1 mm, using a pressure 25 kg/cm$^2$ at 216° C. for 270 minutes to obtain a copper-clad laminate. The peel strength (A) of the 35 $\mu$m copper carrier layer from the ultra-thin copper foil was measured in accordance with JIS-C-6481 and found to be 0.009 kgf/cm. The copper carrier could easily be peeled off from the laminate, and the peel strength (A) was uniform across the sample.

EXAMPLE 5

Composite foils produced by the method of Example 1 were laminated on both surfaces of an inner layer, material on which wiring patterns previously had been formed, using a 0.18 mm thick FR-4 prepreg as an intermediate layer and by pressing at 175° C. and 25 kg/cm$^2$ for 60 minutes. After cooling down, the peel strength (A) of the 35 $\mu$m metallic carrier layer from the ultra-thin copper foil was measured in accordance with JIS-C-6481 and found to be 0.015 kgf/cm. The supporting metallic layer could easily be separated from the laminate, and the peel strength (A) was uniform.

EXAMPLE 6

Using a copper-clad laminate produced by the methods of Example 1, a drill having a diameter of 0.3 mm was used to make holes in the laminate. A conventional desmear treatment with potassium permanganate solution was done to remove epoxy resin. Then, the panel was plated to a thickness of 15 μm. A circuit pattern was formed (line width/line space=50 μm/50 μm) to obtain a printed wiring board. The wiring pattern was found to be free of shorts or open spaces. Two of these printed wiring boards were laminated together using a 0.18 mm thick FR-4 prepreg by hot pressing to obtain a multi-layer printed wiring board having four conductive layers. There were no problems. The ultra-thin copper foil was not torn and no wrinkles were formed. Thus, an improved multi-layer printed wiring board was obtained in both Examples 5 and 6, which had very fine 50 μm circuit lines and spaces.

EXAMPLE 7

To the ultra-thin copper foil in each of the copper-clad laminates made in Examples 1–5, copper was electrodeposited to a total thickness of 18 μm. Next, the peel strength (B) of 18 μm thick copper layer from substrate was measured in accordance with JIS-C-6481. The ultra-thin copper cannot be tested by this method as it is too thin and weak, thus, the additional copper depositing is applied to permit the test to be done.

A circuit pattern was formed by conventional etching methods using acid copper chloride and dry film resist on the five copper-clad laminates from Examples 1–5. The line width/line spacing again was 50 μm/50 μm. The results obtained are shown in Table 1.

TABLE 1

|  | Peel Strength (B) (kgf/cm) | Etching Properties |
| --- | --- | --- |
| Example 1 | 1.3 | Good |
| Example 2 | 1.2 | Good |
| Example 3 | 1.3 | Good |
| Example 4 | 1.0 | Good |
| Example 5 | 1.3 | Good |

The above results show suitable performance of the copper-clad laminates for electronic equipment. It can be concluded that the peel strength (B) of the ultra-thin copper foil is comparable to conventional thick copper foils, and much greater than the peel strength (A) measured between the ultra-thin copper and the carrier layer. Furthermore, these laminates were found to yield very superior circuit patterns in that they had no opens or shorts at a line width and spacing of 50 μm.

EXAMPLE 8

An electrolytically deposited copper foil having a thickness of 35 μm was used as a metal carrier layer. On the shiny side of the foil, a release layer was formed, followed by a copper depositing step to obtain a composite copper foil, using the following procedures A and B.
A. Formation of the Organic Release Layer The 35 μm copper foil was first acid washed for 30 seconds in an aqueous solution of $H_2SO_4$ (150 g/L), after which the foil was rinsed in distilled water for 15 seconds to remove residual acid. Then, the rinsed copper foil was dipped in an aqueous solution of CBTA (5 g/L) at a temperature of 40° C. for 30 seconds, removed and rinsed in deionized water to form an organic release layer of CBTA.
B. Copper Depositing Step On the organic release layer, copper was electrodeposited with a current density of 5 A/dm² by using a copper sulfate electrodepositing bath having a bath temperature of 40° C., and containing 250 g/L of copper sulfate and 70 g/L of sulfuric acid, for 150 seconds. Thus, a composite foil in which a copper foil having a thickness of 3 μm was formed on the release layer was obtained. The resultant composite foil was evaluated for their releasability, both as made and after heating to either 155° C. for 15 minutes, by using the following procedure (C).
C. Evaluation Procedure To the ultra-thin copper foil in the composite foil, a Scotch tape was adhered. Then, the adhered Scotch tape was peeled off from the composite foil to see whether the ultra-thin copper foil was separated from the copper carrier layer along with the scotch tape or not (i.e., whether the separation condition is acceptable or not).

The results are shown in Table 2.

EXAMPLES 9–12 AND REFERENCE EXAMPLES 1 AND 2

In each of Examples 9–12, a composite foil was made in the same manner as in Example 8, except that an organic release layer was formed by using an aqueous solution (5 g/L) of a nitrogen- and/or sulfur-containing compound other than CBTA shown in Table 2.

The resulting composite foils were evaluated in their releasability in the same manner as in Example 8.

The results are shown in Table 2.

COMPARATIVE EXAMPLES 1–3

In each of Comparative Examples 1–3, a composite foil was made in the same manner as in Example 8, except that an organic release layer was formed by using an aqueous solution (5 g/L) of a nitrogen- and/or sulfur-containing compound shown in Table 2.

The resulting composite foils were evaluated in their releaseability in the same manner as in Example 8.

The results are shown in Table 2.

EXAMPLES 13–15

In each Examples 13–15, a composite foil was made in the same manner as in Example 8, except that an organic release layer was formed by using an aqueous solution (5 g/L) of a carboxylic acid compound shown in Table 2.

The resulting composite foils were evaluated in their releaseability in the same manner as in Example 8.

The results are shown in Table 2.

COMPARATIVE EXAMPLES 4 and 5

In each Comparative Examples 4–5, a composite foil was made in the same manner as in Example 8, except that an organic release layer was formed by using an aqueous solution (5 g/L) of maleic acid (Co. Ex. 4) or 1,4-butane dicarboxylic acid (Co. Ex. 5)and the composite foils were heated to 180° C.

The resultant composite foils were evaluated in their releasability in the same manner as in Example 8.

The results are shown in Table 2.

TABLE 2

| | Compound Nitrogen-containing and Sulfur-Containing | Release Ability | |
|---|---|---|---|
| | | As Made | After 155° C. |
| Ex. 8 | CBTA (carboxybenzotriazole) | Acceptable | Acceptable |
| Ex. 9 | BTD-U (N,N'-bis(benzotriazolyl-methyl)urea) | Acceptable | Acceptable |
| Ex. 10 | MBT (2-mercaptobenzothiazole) | Acceptable | Acceptable |
| Ex. 11 | TCA (thiocyanuric acid) | Acceptable | Acceptable |
| Ex. 12 | ATA (3-amino-1H-1,2,4-triazole) | Acceptable | Acceptable |
| Ref. 1 | BTA (1,2,3-benzotriazole) | Acceptable | Unacceptable |
| Ref. 2 | BIT (2-benzimidazolethiol) | Acceptable | Unacceptable |
| Co. Ex. 1 | 1-hydroxy benzothiazole | Unacceptable | Unacceptable |
| Co. Ex. 2 | 1H-1,2,4-triazole | Unacceptable | Unacceptable |
| Co. Ex. 3 | N,N'-ethylenethiourea | Unacceptable | Unacceptable |
| | Acids | As Made | After 180° C. |
| Ex. 13 | Oleic acid | Acceptable | Acceptable |
| Ex. 14 | linoleic acid | Acceptable | Acceptable |
| Ex. 15 | linoleic acid | Acceptable | Acceptable |
| Co. Ex. 4 | malonic acid | Unacceptable | Unacceptable |
| Co. Ex. 5 | 1,4 butane dicarboxylic acid | Unacceptable | Unacceptable |

EXAMPLE 16

An electrolytically deposited copper foil having a thickness of 35 μm was used as a metal carrier layer. On the matte side of the foil, a release layer was formed, followed by a copper depositing step, a bond enhancing treatment, and a passivation treatment to obtain a composite copper foil, using the following procedures A–D.

A. Formation of the Organic Release Layer

The 35 μm copper foil was first acid washed for 30 seconds in an aqueous solution of $H_2SO_4$ (150 g/L), after which the foil was rinsed in distilled water for 15 seconds to remove residual acid. Then, the rinsed copper foil was dipped in an aqueous solution of CBTA (5 g/L) at a temperature of 40° C. for 30 seconds, removed and rinsed in deionized water to form an organic release layer of CBTA.

B. Copper Depositing Step

On the organic release layer, copper was electrodeposited with a current density of 5 A/dm² by using a copper sulfate electrodepositing bath having a bath temperature of 40° C., and containing 250 g/L of copper sulfate and 70 g/L of sufuric acid, for 150 seconds. Thus, a composite foil in which a copper foil having a thickness of 3 μm was formed on the release layer was obtained.

D. Bond Enhancing Treatment

The bond enhancing treatment was carried out on the surface of the ultra-thin copper foil by a conventional nodularizing surface treatment using a copper sulfate electrodepositing bath. The current density was increased to form nodules of copper on the surface of the ultra-thin copper.

E. Passivation Treatment

A passivation treatment was applied to the surface of the bond enhanced ultra-thin copper foil by depositing zinc chromate from solution by conventional electrodeposition methods to obtain a composite foil ready for lamination.

The composite foil was laminated on a sheet of 0.1 mm thick FR-4 prepreg, and then hot pressed under a pressure of 25 kg/cm² at 175° C. for 60 minutes to obtain a copper-clad laminate.

The peel strength (A) of the 35 μm copper carrier layer from the ultra-thin copper foil was measured in accordance with JIS-C-6481, and found to be 0.03 kgf/cm. The copper carrier layer could easily be separated from the copper-clad laminate, and the peel strength (A) was found to be uniform across the sample.

To the ultra-thin copper foil on the copper-clad laminate, copper was electrodeposited to a total thickness of 18 μm. Next, the peel strength (B) of 18 μm thick copper layer from substrate was measured in accordance with JIS-C-6481 and found to be 1.6 kgf/cm.

As demonstrated above, the invention provides an organic release layer between a metallic carrier and an ultra-thin copper foil. The bond strength is uniform and low enough so that the ultra-thin copper foil is not damaged when the metal carrier layer is stripped off. Thus, an ultra-thin copper foil having improved handling properties has been produced. The organic release layer can be very easily formed by dipping or coating an aqueous solution containing the selected organic compound.

The release layer is not inorganic, and only a thin organic layer remains on the ultra-thin copper foil after separating the metal carrier layer. Thus, only cleaning with dilute acid to remove the organic residue is needed. Furthermore, since no metal is used in the release layer, the supporting metallic layer can be recycled and waste solution disposal is easy, without causing environmental problems.

What is claimed is:

1. A composite foil comprising an organic release layer uniformly disposed between a metal carrier layer and an ultra-thin copper foil, wherein said organic release layer is selected from the group consisting of nitrogen-containing compounds, sulfur-containing compounds, and carboxylic acids and wherein the peel strength between said ultra-thin copper foil and said metal carrier layer is about 0.005–0.3 kgf/cm.

2. A composite foil of claim 1, wherein the release layer is formed of an organic compound capable of forming a chemical bond with said copper foil and said metal carrier layer and permiting uniform deposition of said ultra-thin copper foil; and wherein, when the composite foil is laminated with heating at a temperature of not less than 150° C. to a substrate so that the ultra-thin copper foil faces the substrate, a peel strength (A) of the metal carrier from the ultra-thin copper foil is lower than a peel strength (B) of the ultra-thin copper foil from the substrate, thereby permitting the metal carrier layer to be separated from said copper foil after laminating.

3. A composite foil of claim 2, wherein said ultra-thin copper foil has an exposed copper surface subjected to a nodularization treatment to enhance the peel strength (B) between the ultra-thin copper foil and a substrate.

4. A composite foil of claim 3, wherein said exposed copper has a surface subjected to a passivation treatment to prevent oxidation of the surface of the ultra-thin copper foil.

5. A composite foil of claim 1, wherein said nitrogen-containing compound has a substituent.

6. A composite foil of claim 1, wherein said sulfur-containing compound is a member of the group consisting of mercaptobenzothiazol, thiocyanuric acid and 2-benzimidazolethiol.

7. A composite foil of claim 1, wherein said carboxylic acid is a mono-carboxylic acid.

8. A composite foil of claim 7, wherein said mono-carboxylic acid is selected from the group consisting of oleic acid, linoleic acid, and linolenic acid.

9. A composite foil of claim 1, wherein said metal carrier layer is copper or copper alloy.

10. A composite foil of claim 1, wherein said metal carrier layer is copper-coated aluminum.

11. A composite foil of claim 1, wherein the thickness of said ultra-thin copper foil is not more than 12 µm.

12. A composite foil of claim 1, wherein said metal carrier layer has a thickness up to about 5 mm.

13. A composite foil of claim 1, wherein said metal carrier layer has a thickness of about 18–70 µm.

14. A copper-clad laminate comprising a composite foil of claim 1 laminated to a substrate.

15. A copper-clad laminate of claim 14, wherein the metal carrier layer has been removed to expose said ultra-thin copper foil.

16. A printed wiring board comprising the copper-clad laminate of claim 15 in which a wiring pattern is formed on said ultra-thin copper foil.

17. A multi-layer printed wiring board formed by laminating a plurality of printed wiring boards according to claim 16.

18. A multi-layer printed wiring board formed by laminating on at least one side of an inner layer board containing wiring patterns a composite foil according to claim 1 with said metal carrier layer exposed to obtain a copper clad laminate, separating the exposed metal carrier layer from the copper clad laminate to expose the ultra-thin copper foil, and forming a wiring pattern from said ultra-thin copper foil, thereby obtaining a multi-layer printed wiring board.

19. A multi-layer printed wiring board formed by laminating a plurality of printed wiring boards according to claim 18.

20. A composite foil comprising an organic release layer uniformly disposed between a metal carrier layer and an ultra-thin copper foil, wherein said release layer is selected from the group consisting of nitrogen-containing compounds, sulfur-containing compounds and carboxylic acids, and said nitrogen-containing compounds have a substituent and said sulfur-containing compounds are members of the group consisting of mercaptobenzothiazol, thiocyanuric acid and 2-benzimidazolethiol.

21. A composite foil of claim 20, wherein said nitrogen-containing compound having a substituent is a triazole compound having a substituent.

22. A composite foil of claim 21, wherein said triazole compound having a substituent is a member of the group consisting of carboxylbenzotriazole, N,N'-bis (benzotoriazolylmethyl)urea and 3-amino-1H-1,2,4-triazole.

23. A process for producing a composite foil comprising:
 a. uniformly applying an organic release layer to a metal carrier layer wherein said organic release layer is selected from the group consisting of nitrogen-containing compounds, sulfur-containing compounds, and carboxylic acids and the peel strength between said ultra-thin copper foil and said metal carrier layer is about 0.005–0.3 kgf/cm; and
 b. electrodepositing an ultra-thin copper layer on said organic release layer.

24. A process of claim 23, wherein the release layer forms a chemical bond with said copper foil and said metal carrier layer and permitting uniform deposition of said ultra-thin copper foil; and
 wherein, when the composite foil is laminated with heating at a temperature of not less than 150° C. to a substrate so that the ultra-thin copper foil faces the substrate, a peel strength (A) of the metal carrier from the ultra-thin copper foil is lower than a peel strength (B) of the ultra-thin copper foil from the substrate, thereby permitting the metal carrier layer to be separated from said copper foil after laminating.

25. A process of claim 24, wherein said organic compound is a nitrogen-containing compound.

26. A process of claim 25, wherein said nitrogen-containing compound has a substituent.

27. A process of claim 26, wherein said nitrogen-containing compound having a substituent is a triazole compound having a substituent.

28. A process of claim 27, wherein said triazole compound having a substituent is a member of the group consisting of carboxylbenzotriazole, N,N'-bis (benzotoriazolylmethyl)urea and 3-amino-1H-1,2,4-triazole.

29. A process of claim 24, wherein said organic compound is a sulfur-containing compound.

30. A process of claim 29, wherein said sulfur-containing compound is a member of the group consisting of mercaptobenzothiazol, thiocyanuric acid and 2-benzimidazolethiol.

31. A process of claim 24, wherein said organic compound is a carboxylic acid.

32. A process of claim 31, wherein said carboxylic acid is a mono-carboxylic acid.

33. A process of claim 32, wherein said mono-carboxylic acid is a member of the group consisting of oleic acid, linoleic acid, and linolenic acid.

34. A process of claim 23, wherein said organic release layer is applied to said metal carrier layer by dipping said metal carrier layer in an aqueous solution of said organic compound, thereby leaving a thin layer of said organic compound bonded to said metal carrier layer.

35. A process of claim 23, wherein said electrodeposition employs an electrolytic bath which is substantially free of acid.

36. A process of claim 35, wherein said electrolytic bath is a copper cyanide or copper pyrophosphate bath.

37. A process of claim 36, wherein said electrodeposition is used to deposit at least 0.5 µm of copper on said organic release layer.

38. A process of claim 36, wherein said electrodeposition employs a first electrolytic bath containing copper pyrophosphate to deposit a first layer of copper, followed by further electrodeposition using a second electrolytic bath containing copper sulfate and sulfuric acid to deposit a second layer of copper on said first layer.

39. A process of claim 38, wherein said first layer is at least 0.50 µm thick and the thickness of said first and second layers is up to about 12 µm.

40. A process of claim 23, wherein said electrodeposition employs an electrolytic bath comprising copper sulfate and sulfuric acid.

41. A process of claim 23, further comprising the step of subjecting said ultra-thin copper layer to a nodularizing treatment to improve adhesion of said ultra-thin copper layer to a substrate.

42. A process of claim 41, further comprising the step of subjecting said nodularized ultra-thin copper layer to a passivation treatment to prevent oxidation of said ultra-thin copper layer.

43. A process of claim 42, wherein said passivation treatment comprises depositing at least one member of the group consisting of zinc, zinc chromate, nickel, tin, cobalt and chromium to said nodularized ultra-thin copper layer.

* * * * *